United States Patent [19]

Nicollini et al.

[11] Patent Number: 5,684,425

[45] Date of Patent: Nov. 4, 1997

[54] ANALOG SWITCH FOR LOW SUPPLY VOLTAGE MOS INTEGRATED CIRCUITS

[75] Inventors: Germano Nicollini, Piacenza; Pierangelo Confalonieri, Canonica D'Adda, both of Italy

[73] Assignee: SGS-Thomson Microelectronics, S.r.l., Milan, Italy

[21] Appl. No.: 394,671

[22] Filed: Feb. 27, 1995

[30] Foreign Application Priority Data

Feb. 20, 1994 [EP] European Pat. Off. ............ 94830091

[51] Int. Cl.⁶ ..................................... H03K 17/687
[52] U.S. Cl. .................. 327/437; 327/310; 327/319
[58] Field of Search ........................ 327/310, 319, 327/437

[56] References Cited

U.S. PATENT DOCUMENTS 3,636,378  1/1972  Chashi et al. .................... 307/251

FOREIGN PATENT DOCUMENTS 0150606  7/1985  European Pat. Off. .
0292913  11/1988  European Pat. Off. .
362102619  5/1987  Japan ............................. 327/437
404156716  5/1992  Japan ............................. 327/437
404178012  6/1992  Japan ............................. 327/437

OTHER PUBLICATIONS

Patent Abstracts of Japan, vol. 10, No. 352 (E-458), 27 Nov. 1986 & JP-A-61 150 521 (Toshiba Corp.), 9 Jul. 1986.
"Fast CMOS switch provides 60-dR isolation at 10 MHz" Electronic Design vol. 30, No. 8 Apr. 15, 1982, p. 260.

*Primary Examiner*—Margaret Rose Wambach
*Attorney, Agent, or Firm*—Robert Groover; Betty Formby; Matthew Anderson

[57] ABSTRACT

Electronic switch for low-voltage supply circuits completed with CMOS technology and comprising a first, a second and a third circuit element (SW1, SW2, SW3) consisting each of a pair of complementary transistors. The first and second of said elements (SW1, SW2) are inserted between two connection terminals of the switch (A,B) while the third element SW3 is inserted between a node (C) included between the first and the second element of a voltage reference (VCM). The first and second element are driven to conduction in phases ($\phi1$) not overlapping the phases ($\phi2$) in which it conducts the third element.

35 Claims, 1 Drawing Sheet

ANALOG SWITCH FOR LOW SUPPLY VOLTAGE MOS INTEGRATED CIRCUITS

CROSS-REFERENCE TO RELATED APPLICATION

This application claims priority from EPC App'n 94830091.8, filed Feb. 28, 1994, which is hereby incorporated by reference. However, the content of the present application is not necessarily identical to that of the priority application.

BACKGROUND AND SUMMARY OF THE INVENTION

The present invention relates to a monolithically integrable switching device and in particular an electronic switch for completed circuits with CMOS technology and with low supply voltage and which can be used between two nodes of the circuit whose potential and impedance conditions are very dissimilar.

In many cases there is a need to connect for certain time intervals, e.g. a reset of initial conditions, two circuit nodes of which one is driven by low impedance circuit means and can take on all the potential values included between that of ground and that of supply while the other is held in high impedance conditions with limited possibility of potential variations compared with a reference value.

The potential reference is generally equal to half the supply potential value.

An important problem is that of being able to ensure perfect insulation between the two nodes while holding fixed the high impedance node potential.

An example of a circuit in which can be found the problem just indicated is that of an operational amplifier whose gain is fixed by means of the capacitance of two condensers, one at the inverting input (−) and the other connected between the inverting input and the amplifier output.

During preset time intervals a so-called analog reset operation is performed by short-circuiting through an electronic switch the ends of the condenser inserted between the amplifier input and output.

The input condenser is connected to a potential reference to which is also connected the non-inverting terminal (+) of the amplifier in order to memorise the 'offset' of the amplifier as charged with the input capacitance.

The electronic switch in normal operating conditions of the amplifier must ensure at its own ends a perfect insulation.

In CMOS completed circuits said switch is generally provided for sufficiently high supply voltages, e.g. more than 3V, with a so-called 'pass-transistor', consisting of a pair of complementary transistors which have their respective source and drain terminals connected together and are driven simultaneously upon switching.

This solution cannot however be adopted in CMOS completed circuits with low supply voltages, e.g. 2V, because under these conditions the gate-source voltages of the complementary transistors are, during that which should be closing of the switch, actually less than the respective threshold voltages, or starting voltages, increased, as is known to those skilled in the art, by the 'body' effect. The pass-transistor, even if closing is commanded, cannot then lead.

Since in the art of completed circuits there is a tendency to reduce supply voltages used and in CMOS applications there are already employed supply voltages or 2V or 1.5V, those skilled in the art have adopted two different solutions, one of which is a circuit solution and the other technological.

The first solution consists of using as an electronic switch only an N-channel transistor which is driven upon conduction using the supply voltage multiplied two or three times so as to achieve a gate-source voltage surely greater than the threshold even though increased by the body effect.

One drawback however is the need for relatively complex circuitry means to achieve the overvoltage.

The technological solution consists of using a CMOS integration process which permits achieving transistors with very low threshold voltage, at the limit 0V.

But this solution is not really effective under insulation conditions, i.e. opening of the switch, because with gate-source voltages only a little lower than threshold voltage there are induced non-negligible currents below threshold, even on the order of μA, which can change the potential conditions of the high impedance node.

In the operational amplifier example indicated above the charges of the capacitances on the inverting input would be disturbed.

The technical problem underlying the present invention is to provide an electronic switch for insertion between two nodes and respectively with high-impedance with potential practically fixed and low-impedance with variable potential of a circuit with very low supply voltage and completed with CMOS technology which would avoid all the shortcomings of the known solutions.

This technical problem is solved with an electronic switch of the type indicated above and defined in the characterising part of the claims which follow this description.

The characteristics and advantages of an electronic switch in accordance with the present invention are set forth in the description of an embodiment thereof given below by way of nonlimiting example with reference to the annexed drawing.

BRIEF DESCRIPTION OF THE DRAWING

The disclosed inventions will be described with reference to the accompanying drawings, which show important sample embodiments of the invention and which are incorporated in the specification hereof by reference, wherein:

The sole FIGURE shows a diagram of the circuit of an electronic switch in accordance with the present invention.

DETAILED DESCRIPTION OF THE PREFERRED EMBODIMENTS

Figure 1:
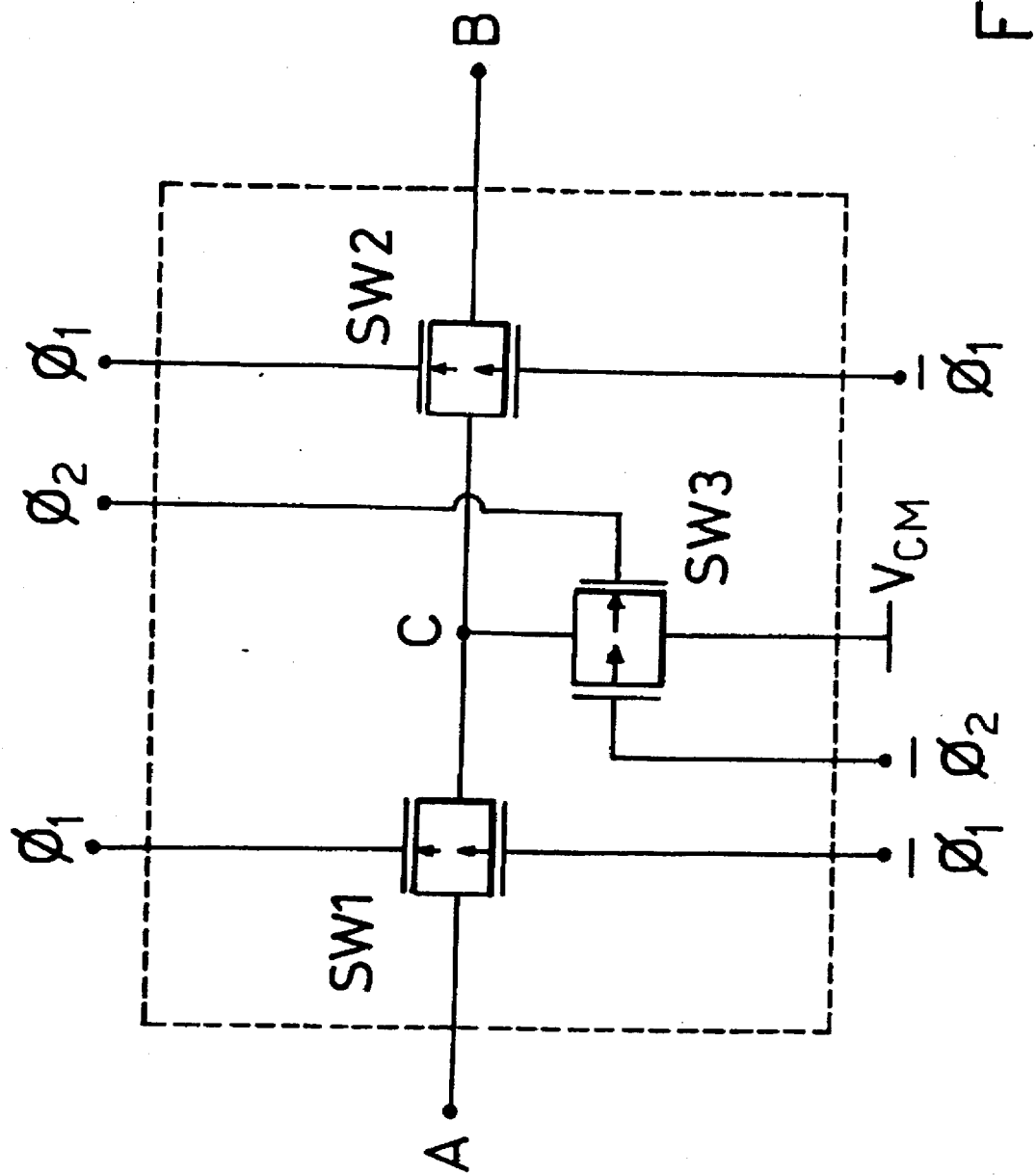

The numerous innovative teachings of the present application will be described with particular reference to the presently preferred embodiment (by way of example, and not of limitation), in which:

An electronic switch in accordance with the present invention comprises, as shown in the FIGURE, a first, a second and a third circuit elements designated by SW1, SW2 and SW3 respectively and comprising each a pair of complementary transistors.

The first, SW1, and the second, SW2, of these circuit elements, which are pass-transistors, are inserted between two connecting terminals of the switch and designated by A and B.

The third circuit element SW3 is inserted between a node C and a voltage reference VCM.

The node C is a point of the connection between the circuit elements SW1 and SW2.

To the gate terminals of the complementary transistors both of the first and the second circuit elements are applied two command signals in phase opposition, φ1 and φ1 which determine simultaneous conduction of the mutually complementary transistors.

At the gate terminals of the two complementary transistors of the third circuit element are applied instead two command signals in phase opposition and designated in the FIGURE by φ2 and φ2 which determine simultaneous conduction of the transistors.

In accordance with the present invention for correct operation the signals φ1 and φ2 must not be with overlapping phases.

In addition, the integration process, of the CMOS type, must allow achievement of transistors with very low threshold voltages, as in the known technology solution.

The structure of the switch indicated in the FIGURE, although remaining very simple, avoids the poor insulation problems.

It should be noted that a switch in accordance with the present invention operates correctly just when the prevailing impedance and potential conditions at nodes A and B constituted a problem for those skilled in the art.

During the closing phase φ1 the two elements SW1 and SW2 behave as though there were a single pass-transistor and no problems arise because the gate-source voltage of the transistors can hold itself above the threshold voltage.

During the opening or insulation phase the node C is forced by the third element SW3, formerly extinguished, to the reference potential of voltage VCM.

The node which must be insulated is A if it is the high-impedance node in the completed circuit.

In this case currents below threshold through the transistors of the second circuit element are forced to flow on the voltage reference, which must be appropriately chosen and in general has a value equal to half the supply voltage.

The third element SW3 forcing the node C to said reference potential ensures also that the gate-source voltages of the complementary transistors of the first element SW1 are surely much lower than the respective threshold voltages.

In this manner any currents below threshold in the element SW1 are quite negligible and there is thus ensured perfect insulation of node A.

The embodiment described here is provided with a pair of complementary transistors for each circuit element, but even with a single transistor for the elements SW1 and SW3 it would be valid.

Naturally other modifications and replacements are possible in a manner known to those skilled in the art.

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, the disclosed switch configuration can be used in a huge variety of circuit topologies, and in combination with a large variety of other circuit elements. In general, the disclosed switch element can be substituted for the traditional "pass gate" in any CMOS integrated circuit, and is particularly attractive in low-voltage CMOS circuits.

While the circuit of FIG. 1 is particularly advantageous for analog reset operations, it is not limited to such contexts.

In general, the disclosed switch element can be substituted for the traditional 'pass gate' in any CMOS integrated circuit, and is particularly attractive in low-voltage CMOS circuits.

What is claimed is:

1. An integrated circuit switch, connected to be driven from first and second power supply voltage connections, and comprising:

first and second CMOS pass gates,
jointly connected in series between first and second terminals to provide an analog signal path between first and second signal terminals,
said first and second pass gates both being connected to be turned on when a first clock phase is active,
said first and second pass gates defining an intermediate node therebetween; and a third CMOS pass gate
connected between said intermediate node and a common-mode potential which is intermediate between said first and second power supply voltages, and
connected to be turned on by the active phase of a second clock phase, said first and second clock phases being completely non-overlapping.

2. The integrated circuit switch of claim 1, wherein said pass gates are formed of NMOS and PMOS transistors which have respective threshold voltage magnitudes $|V_T|$ of less than one Volt.

3. The integrated circuit switch of claim 1, wherein said pass gates are formed of NMOS and PMOS transistors which have respective threshold voltage magnitudes $|V_T|$ of less than 0.75 Volt.

4. The integrated circuit switch of claim 1, wherein said first power supply voltage is positive and said second power supply voltage is chip ground.

5. The integrated circuit switch of claim 1, wherein said first power supply voltage is in the range between 1.5 and 3 volts, and said second power supply voltage is chip ground.

6. The integrated circuit switch of claim 1, wherein said common-mode potential is approximately halfway between said first and second power supply voltages.

7. The integrated circuit switch of claim 1, wherein said first and second power supply voltages differ by less than three volts.

8. An integrated circuit analog switch, connected to be driven from first and second power supply voltage connections, and comprising:

first and second pass elements,
jointly connected in series to provide an analog signal path between first and second signal terminals,
said first and second pass elements both being connected to be turned on when a first clock phase is active,
said first and second pass elements defining an intermediate node therebetween; and a third pass element
connected between said intermediate node and a common-mode potential which is intermediate between said first and second power supply voltages, and
connected to be turned on by the active phase of a second clock phase, said first and second clock phases being completely non-overlapping.

9. The integrated circuit switch of claim 8, wherein said third pass element is formed of NMOS and PMOS transistors which have respective threshold voltage magnitudes $|V_T|$ of less than one Volt.

10. The integrated circuit switch of claim 8, wherein said third pass element is formed of NMOS and PMOS transistors which have respective threshold voltage magnitudes $|V_T|$ of less than 0.75 Volt.

11. The integrated circuit switch of claim 8, wherein said first power supply voltage is positive and said second power supply voltage is chip ground.

12. The integrated circuit switch of claim 8, wherein said first power supply voltage is in the range between 1.5 and 3 volts, and said second power supply voltage is chip ground.

13. The integrated circuit switch of claim 8, wherein said common-mode potential is approximately halfway between said first and second power supply voltages.

14. The integrated circuit switch of claim 8, wherein said first and second power supply voltages differ by less than three volts.

15. An integrated circuit analog switch, connected to be driven from first and second power supply voltage connections, and comprising:
  first and second CMOS pass gates,
    jointly connected in series to provide an analog signal path between first and second signal terminals,
    said first and second CMOS pass gates both being connected to be turned on when a first clock phase is active,
    said first and second CMOS pass gates defining an intermediate node therebetween; and
  a third CMOS pass gate
    connected between said intermediate node and a common-mode potential which is intermediate between said first and second power supply voltages, and
    connected to be turned on by the active phase of a second clock phase, said first and second clock phases being completely non-overlapping.

16. The integrated circuit switch of claim 15, wherein said CMOS pass gate is formed of NMOS and PMOS transistors which have respective threshold voltage magnitudes $|V_T|$ of less than one Volt.

17. The integrated circuit switch of claim 15, wherein said CMOS pass gate is formed of NMOS and PMOS transistors which have respective threshold voltage magnitudes $|V_T|$ of less than 0.75 Volt.

18. The integrated circuit switch of claim 15, wherein said first power supply voltage is positive and said second power supply voltage is chip ground.

19. The integrated circuit switch of claim 15, wherein said first power supply voltage is in the range between 1.5 and 3 volts, and said second power supply voltage is chip ground.

20. The integrated circuit switch of claim 15, wherein said common-mode potential is approximately halfway between said first and second power supply voltages.

21. The integrated circuit switch of claim 15, wherein said first and second power supply voltages differ by less than three volts.

22. A method of analog signal switching in an integrated circuit which is connected to be driven from first and second power supply voltage connections, said method comprising:
  providing first and second CMOS pass gates, jointly connected in series to provide an analog signal path between first and second signal terminals, said first and second pass gates defining an intermediate node therebetween;
  providing a third CMOS pass gate, connected between said intermediate node and a common-mode potential which is intermediate between said first and second power supply voltages;
  driving said first and second CMOS pass gates with a first clock phase; and
  driving said third CMOS pass gate with a second clock phase, said first and second clock phases being completely non-overlapping.

23. The integrated circuit analog switching method of claim 22, wherein said pass gates are formed of NMOS and PMOS transistors which have respective threshold voltage magnitudes $|V_T|$ of less than one Volt.

24. The integrated circuit analog switching method of claim 22, wherein said pass gates are formed of NMOS and PMOS transistors which have respective threshold voltage magnitudes $|V_T|$ of less than 0.75 Volt.

25. The integrated circuit analog switching method of claim 22, wherein said first power supply voltage is positive and said second power supply voltage is chip ground.

26. The integrated circuit analog switching method of claim 22, wherein said first power supply voltage is in the range between 1.5 and 3 volts, and said second power supply voltage is chip ground.

27. The integrated circuit analog switching method of claim 22, wherein said common-mode potential is approximately halfway between said first and second power supply voltages.

28. The integrated circuit analog switching method of claim 22, wherein said first and second power supply voltages differ by less than three volts.

29. A method of performing analog reset in an integrated circuit which is connected to be driven from first and second power supply voltage connections, said method comprising:
  providing first and second pass elements jointly connected in series to provide an analog signal path between first and second signal terminals, said first and second pass elements defining an intermediate node therebetween;
  providing a third pass element, connected between said intermediate node and a common-mode potential which is intermediate between said first and second power supply voltages;
  turning on said first and second pass elements only during a first clock phase; and
  turning on said third pass element only during a second complementary signals having a second clock phase, said first and second clock phases being completely non-overlapping;
  whereby said first, second, and third pass elements jointly provide an analog reset switch function.

30. The integrated circuit analog reset method of claim 29, wherein each said pass element comprises NMOS and PMOS transistors which have respective threshold voltage magnitudes $|V_T|$ of less than one Volt.

31. The integrated circuit analog reset method of claim 29, wherein each said pass element comprises NMOS and PMOS transistors which have respective threshold voltage magnitudes $|V_T|$ of less than 0.75 Volt.

32. The integrated circuit analog reset method of claim 29, wherein said first power supply voltage is positive and said second power supply voltage is chip ground.

33. The integrated circuit analog reset method of claim 29, wherein said first power supply voltage is in the range between 1.5 and 3 volts, and said second power supply voltage is chip ground.

34. The integrated circuit analog reset method of claim 29, wherein said common-mode potential is approximately halfway between said first and second power supply voltages.

35. The integrated circuit analog reset method of claim 29, wherein said first and second power supply voltages differ by less than three volts.

* * * * *